United States Patent
Daschner et al.

(10) Patent No.: US 8,163,580 B2
(45) Date of Patent: Apr. 24, 2012

(54) MULTIPLE DIE LED AND LENS OPTICAL SYSTEM

(75) Inventors: Walter Daschner, Half Moon Bay, CA (US); Xina Quan, Saratoga, CA (US); Nanze P. Wang, San Jose, CA (US)

(73) Assignee: Philips Lumileds Lighting Company LLC, San Jose, CA (US)

( * ) Notice: Subject to any disclaimer, the term of this patent is extended or adjusted under 35 U.S.C. 154(b) by 944 days.

(21) Appl. No.: 11/201,465

(22) Filed: Aug. 10, 2005

(65) Prior Publication Data

US 2007/0034890 A1 Feb. 15, 2007

(51) Int. Cl.
*H01L 21/00* (2006.01)
(52) U.S. Cl. .......... 438/34; 438/29; 438/31; 438/32; 257/88
(58) Field of Classification Search .......... 438/29, 438/31, 32, 34; 257/88
See application file for complete search history.

(56) References Cited

U.S. PATENT DOCUMENTS

| | | | |
|---|---|---|---|
| 5,914,501 A | 6/1999 | Antle et al. ............. 257/99 |
| 5,995,071 A * | 11/1999 | Mertz ............. 345/84 |
| 6,570,324 B1 | 5/2003 | Tutt et al. |
| 6,583,444 B2 * | 6/2003 | Fjelstad ............. 257/82 |
| 6,885,035 B2 * | 4/2005 | Bhat et al. ............. 257/99 |
| 6,987,613 B2 * | 1/2006 | Pocius et al. ............. 359/565 |
| 2001/0048814 A1 * | 12/2001 | Lenmann et al. ............. 396/154 |
| 2003/0141507 A1 | 7/2003 | Krames et al. ............. 257/79 |
| 2005/0104073 A1 | 5/2005 | Chou |
| 2006/0139953 A1 * | 6/2006 | Chou et al. ............. 362/613 |
| 2011/0057205 A1 * | 3/2011 | Mueller et al. ............. 257/84 |

FOREIGN PATENT DOCUMENTS

| | | |
|---|---|---|
| EP | 0424175 A2 | 4/1991 |
| EP | 1564819 A1 | 8/2005 |
| WO | 8905524 A1 | 6/1989 |
| WO | 02056361 A1 | 7/2002 |
| WO | 03023857 A2 | 3/2003 |
| WO | 2004070839 A2 | 8/2004 |
| WO | 2005034198 A2 | 4/2005 |
| WO | 2005091386 A1 | 9/2005 |

* cited by examiner

*Primary Examiner* — Stephen W Smoot
*Assistant Examiner* — Vicki B Booker

(57) ABSTRACT

A light emitting device includes a number of light emitting diode dies (LEDs) mounted on a shared submount and covered with a single lens element that includes a corresponding number of lens elements. The LEDs are separated from each other by a distance that is sufficient for lens element to include separate lens elements for each LED. The separation of the LEDs and lens elements may be configured to produce a desired amount of light on a target at a predefined distance. In one embodiment, the lens elements are approximately flat type lens elements, such as Fresnel, TIR, diffractive lens, photonic crystal type lenses, prism, or reflective lens.

25 Claims, 2 Drawing Sheets

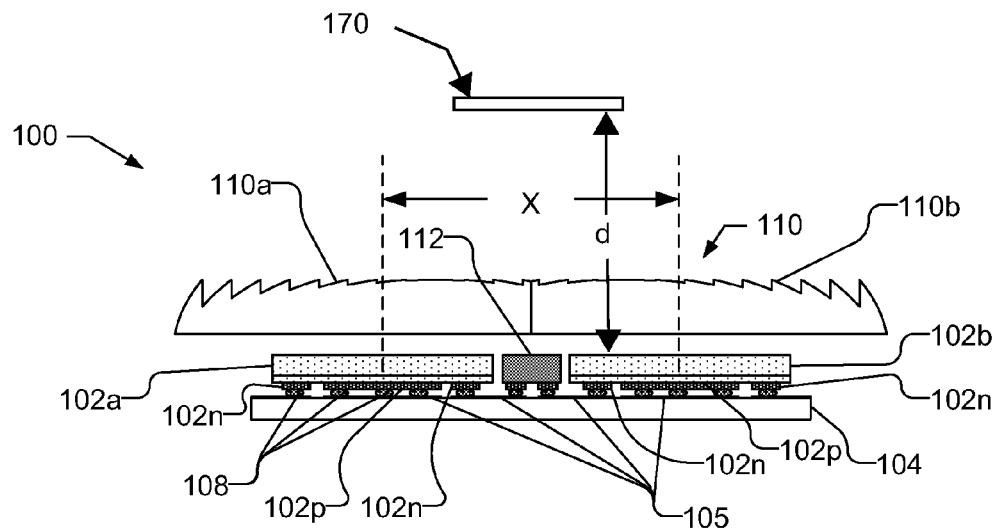
Fig. 1
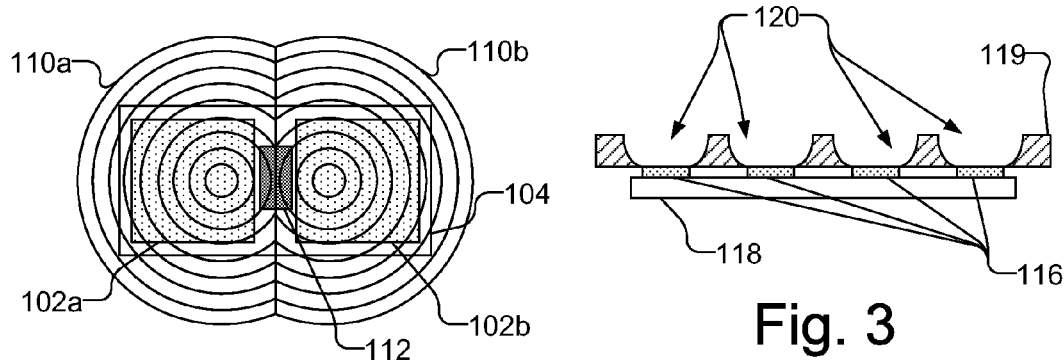
Fig. 2
Fig. 3
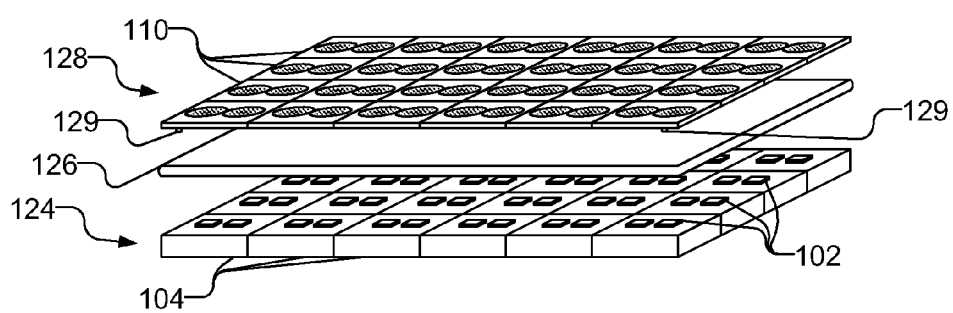
Fig. 4

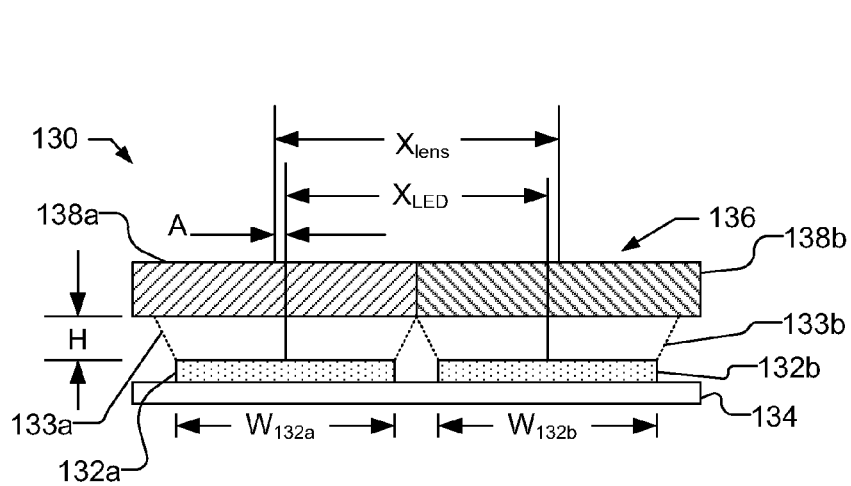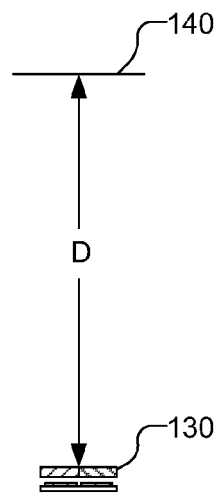
Fig. 5A  Fig. 5B
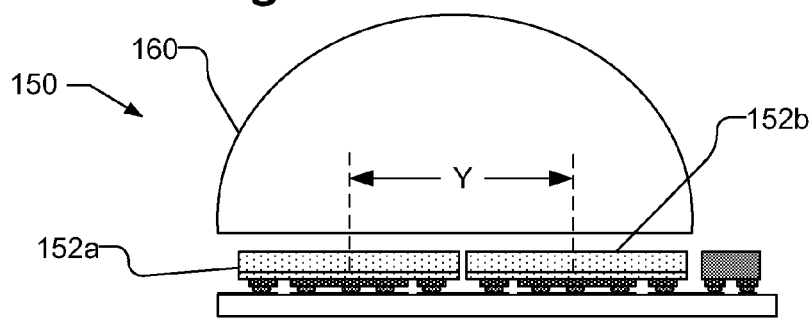
Fig. 6
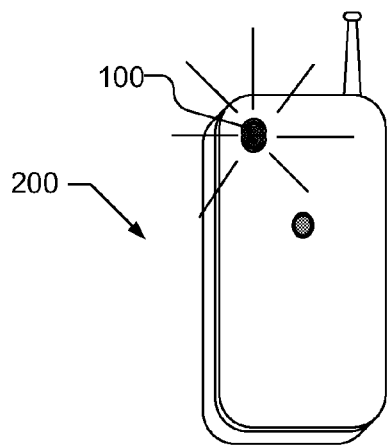
Fig. 7

MULTIPLE DIE LED AND LENS OPTICAL SYSTEM

FIELD OF THE INVENTION

The present invention relates generally to light emitting diodes and more particularly to increasing the light on target from light emitting diodes.

BACKGROUND

Light emitting diode (LED) devices have ever increasing applications. Devices that are capable of generating white light (consisting of R, G, and B components) are particularly interesting because of their potential for replacing conventional light sources, such as light bulbs.

However, some applications have space and illumination considerations that are difficult to overcome even with an LED's relatively small size. For example, flashes for small cameras, such as a cell phone camera, require a large amount of light on target, and yet little room is available for the flash device.

SUMMARY

In accordance with an embodiment of the present invention, a light emitting device includes a number of light emitting diode dies mounted on a shared submount and covered with a single lens element that includes a corresponding number of lens elements. The light emitting diode dies are separated from each other on the submount by a distance that is sufficient for each of the lens elements to focus the light emitted from the light emitting diode dies on the desired target. In one embodiment, the lens elements are approximately flat type lens elements, such as TIR, Fresnel or photonic crystal type lenses. The device of the present invention may be used, advantageously, in such applications as a flash for a cell phone.

BRIEF DESCRIPTION OF THE DRAWINGS

FIG. 1 shows a side view of a device that includes a plurality of light emitting diode (LED) dies mounted on a shared submount and covered by a lens system with a corresponding plurality of lens elements.

FIG. 2 shows a top view of the device of FIG. 1 with the lens system having a plurality of lens elements.

FIG. 3 a side view of a device with a plurality of light emitting diode (LED) dies mounted on a shared submount and covered by a reflective lens system.

FIG. 4 illustrates a perspective view of the fabrication of a device, in accordance with an embodiment of the present invention.

FIG. 5A is a side view of a simplified device with a plurality of LED dies mounted on a shared submount and covered by a lens system.

FIG. 5B shows the simplified device producing a desired light distribution on a desired target at a predefined distance.

FIG. 6 illustrates another device in which two LED dies are positioned near each other and covered by a single lens.

FIG. 7 illustrates a cell phone with the device from FIG. 1 incorporated therein.

DETAILED DESCRIPTION

FIG. 1 shows a side view of a device 100 that includes a plurality of light emitting diode (LED) dies 102a and 102b mounted on a shared submount 104 that is approximately planar and covered by a lens system 110. FIG. 2 shows a top view of the device 100 with the lens system 110 over the LEDs 102a and 102b and submount 104. The lens system 110 includes a separate lens element 110a and 110b that is associated with each of the LED dies 102a and 102b. The lens elements 110a and 110b are separated by a distance that is based on the desired light distribution on target among other optical factors, such as the LED to lens distance, the cone angle of the light for each individual LED, the separation of the LED dies, and the size of the LED dies.

The LEDs 102a and 102b and submount 104 can be the type discussed in U.S. Pat. No. 6,885,035, to Bhat, the entirety of which is incorporated herein by reference. As can be seen in FIG. 1, the p and n contact pads 102p and 102n are on the same side of the LEDs 102a and 102b, in what is often referred to as a flip-chip or inverted design. The light generated by LEDs 102a and 102b is coupled out of the LED on the side opposite to the contact pads. The LEDs 102a and 102b may be, e.g., the III-nitride type, which has a composition that includes, but is not limited to GaN, AlGaN, AlN, GaInN, AlGaInN, InN, GaInAsN, and GaInPN. Typical substrate materials are sapphire, silicon carbide SiC, or III-nitrides, because of the ease of nucleating and growing high quality III-nitride crystals on these substrates. The LEDs 102a and 102b may include a phosphor coating to produce a desired white light.

The contact pads 102n and 102p can be subsequently electrically connected to metal traces 105 on or in the submount 104, e.g., by stud bumps 108. Thus, because the LEDs 102a and 102b have an inverted design, the electrical contacts formed by, e.g., the stud bumps 108 are between the submount 104 and the bottom surface of the LEDs 102a and 102b. A self aligning process, such as a ball grid array (BGA), or other processes, such as thermo-sonic die attachment, may be used to accurately place and attach the LEDs 102a and 102b to the submount 104. The accurate placement of the LED dies, e.g., using a self aligning process or other accurate place and mount process, is advantageous as it permits multiple LED sources to be accurately aligned with a single optical element system 110 with a corresponding number of lens elements 110a and 110b. The use of BGA, for example, permits alignment with a 10 μm maximum placement error. The interconnection between the stud bumps 108 and the metal traces 105 on the submount 104 make electrical connection between the LED and the submount while providing a thermal path for heat removal from the LED during operation. Although the illustrated embodiments refer to gold stud bumps, the interconnects may be made of elemental metals, metal alloys, semiconductor-metal alloys, solders, thermally and electrically conductive pastes or compounds (e.g., epoxies), eutectic joints (e.g., Pd—In—Pd) between dissimilar metals between the LED die and submount, or solder bumps.

The submount 104 may be formed from Si or ceramic, such as high-temperature cofired ceramic, or other appropriate materials, such as thin film alumina or other thermal packaging material. An optional dielectric layer, e.g. SiO2, (not shown) may be included on the submount for electrical isolation between the LED die and the submount substrate. Additional devices may be mounted on the submount 104 or within the circuitry 105 on the submount 104, if desired. For example, III-nitride devices are susceptible to Electro-static Discharge "ESD" damage and may be protected by a power shunting element electrically connected to the LEDs. Accordingly, an ESD protection circuit 112 may be mounted on the submount 104. As illustrated in FIG. 1, the ESD protection circuit 112 may be mounted in the space between the LEDs 102a and 102b. If desired, however, the ESD protection circuit 112 may be mounted elsewhere on the submount 104 or off the submount 104.

The ESD protection circuit 112 may be similar to what is described in Antle et, al. U.S. Pat. No. 5,941,501, which is incorporated herein by reference. In one embodiment, the ESD protection circuit 112 includes Zener diodes connected in parallel with the LEDs 102a and 102b. Alternatively, back-to-back Zener diodes may be fabricated in parallel with the LEDs 102a and 102b to allow the LED to be driven by alternating-current power supplies. Other electronic devices may be included on or within the submount, e.g., photodetectors for monitoring light output or resistors for monitoring current and/or voltage.

As illustrated in FIG. 1, the LED dies 102a and 102b are separated by a distance X, from center to center. The distance X is sufficiently large that there is room for individual lens element 110a and 110b to be formed and positioned over the LED die 102a and 102b, respectively. In general, the distance X should be approximately 130% of the size of the LEDs or greater. With the LEDs 102 accurately placed on the submount 104, the lens system 110 can be aligned with the LEDs 102 and a separation of the lens elements 110a and 110b can be selected to produce a desired amount of light on a target 170 at a predefined distance d.

The individual lens elements 110a and 110b are produced so that they are joined together to form a single integral lens system 110. In one embodiment, the individual lens elements 110a and 110b are substantially flat, such as a refractive Fresnel lens illustrated in FIG. 1. Of course, other flat lens types, including but not limited to a Total Internal Reflection (TIR) Fresnel type lens, a diffractive or a photonic crystal (subwavelength structure) type lens, a prism, reflective lens, or any other optical device that redirects the direction of the light emitted by the LEDs 102a and 102b may be used. A photonic crystal type lens may be formed by roughening or texturing a surface of the LED die. In some embodiments, the textured region is in the form of a periodic array of holes. Photonic crystal structures are described in more detail in U.S. Pub. No. 2003/0141507 titled "LED efficiency using photonic crystal structure," which is incorporated herein by reference. The periodic array of holes has a lattice constant, which may range from $0.1\lambda$ to $4\lambda$, where $\lambda$ is the wavelength of light emitting by the active region within the semiconductor structure. In other embodiments, features larger than 2 microns are formed in the textured region. The textured region acts as a buried light scattering layer within the LED die, which may increase the amount or otherwise affect the light extracted from the device.

FIG. 3 illustrates another type of flat lens system used with a plurality of LED dies. As shown in FIG. 3, a flat reflective lens system 118 is positioned over a plurality of LED dies 116 on a submount 118. The lens system 119 includes a number of reflective lenses 120, each reflective lens being associated and aligned with an underlying LED die 116. The lens system may be manufactured, e.g., by injection molding, casting, transfer molding, or any other appropriate manner. Where a reflective lens system 119 is used, the lens system 119 may be metalized after forming.

In one embodiment, the device 100 may be fabricated by individually coupling the submount 104 with LEDs 102a and 102b with the lens system 110. By way of example, the lens system 110 may be bonded to the submount 104, e.g., using a bonding material, such as a UV or heat cured encapsulant, or snap fitting. Alternatively, the lens system 110 may be mounted to, bonded, or otherwise formed in the structure of the final application, e.g., in the cell phone body, and the submount 104 with LEDs 102a and 102b may be attached to the structure, e.g., using a bonding material or by snap fitting.

FIG. 4 illustrates a perspective view of fabrication of a device 100, in accordance with another embodiment of the present invention. As can be seen in FIG. 4, a plurality of submounts 104 may be produced simultaneously e.g., in a ceramic wafer form 124. The total wafer 124 size may be, e.g., 4×4 inches, while each individual submount 104 may be, e.g., approximately 1×2 mm to 8×12 mm. A plurality of lens systems 110 may also be produced in an array 128, e.g., using injection molding, casting, transfer molding, or any other appropriate manner. The array 128 of lens systems 110 may have a size that is approximately the same size as the submount wafer 124. After the LEDs 102a and 102b are mounted on the submounts 110, as described above, the submount wafer 124 and array 128 of lens systems 110 may be bonded together. In one embodiment, an encapsulant, illustrated as layer 126, may be used, e.g., by injecting a silicone gel or depositing an encapsulant layer between the lens array 128 and the submount wafer 124. If desired, the encapsulant 126 need not be used. The LED dies 102a and 102b may be covered with or the encapsulant 126 may include a wavelength converting material, such as phosphor, to produce the desired colored light from the finished devices.

The array 128 and wafer 124 can be accurately aligned in the x, y, and z directions using conventional alignment processes. Once aligned, the bonding process can be completed using, e.g., a UV or heat curing. With the array 128 formed from, e.g., a hard silicone, and the encapsulant 126 formed from a soft silicone, the process will be compatible with a lead free solder reflow process. In one embodiment, the alignment in the z-direction can be accomplished using stand off features 129, which are integrated in the array 128. The use of one or more stand off features 129 provides a mechanical alignment the underlying submount wafer 124, but may require the sacrifice of a submount. Once bonded, the wafer 124 and array 128 may be diced into separate devices 100 using conventional dicing techniques.

FIG. 5A is a side view of a simplified device 130 with a plurality of LED dies 132a and 132b mounted on a shared submount 134 and covered by a lens system 136 having separate lens elements 138a and 138b. FIG. 5B shows the device 130 and the desired target 140, which is a predefined distance D from the device 130 at which the device 130 will produce a desired light distribution on the target 140. As illustrated in FIG. 5A, the lens elements 138a and 138b are separated by a distance $X_{lens}$, from center to center and the LED dies 132a and 132b are separated by a distance $X_{LED}$. The correlation between distances $X_{lens}$ and $X_{LED}$ and the alignment A of the lens system 136 to the underlying LEDs 132a and 132b are closely controlled to produce a desired amount of light on the target 140 at distance D. By way of example, the distance $X_{LED}$ between the LED dies 132a and 132b may be, e.g., 130% to 500% or greater of the size of the LED dies, while the distance $X_{lens}$ between lens elements 138a and 138b may be approximately 100% to 200% of the distance $X_{LED}$. Other optical factors, such as the distance H between the lens elements 138a, 138b and the LED dies 132a, 132b, the cone angle 133a, 133b of the light captured by the lens elements 138a and 138b, and the size $W_{132a}$, $W_{132b}$ of the LED dies 132a, 132b, also affect amount of light on the target 140 at distance D and, thus, must also be appropriate selected. Thus, by judicious selection of the above parameters, the shape of the resulting cone angle from the light emitted from the device, as well as the direction of the cone with respect to the optical axis of the device, can be predefined to produce a desired amount of light on target 140 at a desired distance D.

The accurate placement of the LED dies 132a and 132b on the submount 134 facilitates control of the correlation between the distances $X_{lens}$ and $X_{LED}$ as well as the alignment A. Moreover, the separation of the LED dies 132a and 132b $X_{LED}$ permits the use of a separate lens element 138a and 138b for each LED die 132a and 132b, respectively. With the use of a separate lens element for each LED die, the efficiency of the system is increased relative to systems that use a single lens for multiple LED dies.

By way of comparison, FIG. 6 illustrates a device 150 in which two LED dies 152a and 152b (sometimes referred to collectively as LEDs 152) are positioned near each other, i.e., the centers are separated by a distance Y, which is less than 30% of the width of the LEDs 152. In such a system, there is insufficient room to use a lens system with separate lens elements for each LED die and thus, a single lens element 160 is used. The use of a single lens element 160 with multiple LEDs 152 results in a system with reduced efficiency. Moreover, with the use of a single lens element 160, the device 150 is much more restricted in the amount of light that can be placed on a target at a predefined distance.

Thus, the use of a relatively large separation between the LEDs 102 in accordance with an embodiment of the present invention, permits an efficient optical design, which can be optimized to provide sufficient illumination in a variety of desired applications, e.g., cell phone flash, running lights or map lights in an automobile, or a camcorder illumination system. FIG. 7, by way of example, illustrates a cell phone 200 with a device 100 incorporated therein. The device 100 with the separated LEDs 102 and separate lens elements 110a and 110b, increases the efficiency of the system by 15% to 45% over a system with a single lens element system and two LEDs. The device 100, however, may be incorporated into other applications, where it is desirable to direct the majority of the flux of an LED into a predefined cone angle, such as map lights, reading lights and spotlights.

Moreover, while the LEDs 102a and 102b are separated from each other, the overall design produces a large amount of illumination from a relatively small device 100, which is particularly advantageous in applications where there is limited real estate, e.g. in a cell phone flash. Further, the separation of the LEDs 102a and 102b is advantageous in heat dissipation, which permits the LEDs 102a and 102b to be driven at a slightly increased current.

It should be understood that while the present invention is described with the use of two LEDs 102a and 102b, additional LEDs may be used if desired, e.g., 4×4 or 6×6 LED dies, where the LEDs are sufficiently separated to permit a separate lens element for a plurality of the LEDs.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A method comprising:
providing a submount;
positioning and mounting a plurality of light emitting diode dies on the submount, the plurality of light emitting diode dies being positioned to be separated from each other;
providing a lens system comprising adjacent asymmetric lens elements;
optically coupling the submount with the plurality of mounted light emitting diode dies to the lens system so that each of the lens elements is aligned with a corresponding light emitting diode die; and
providing an encapsulant in a region that is disposed between the submount with a plurality of light emitting diode dies and the lens system.

2. The method of claim 1, wherein the plurality of light emitting diode dies are positioned to be separated from each other by a distance greater than 130% center to center of the size of the light emitting diode dies.

3. The method of claim 2, wherein a separation between the light emitting diode dies, a separation between optical centers of the lens elements, and an alignment of the lens elements with a respective light emitting diode die are configured to produce a desired light distribution on a target at a predefined distance.

4. The method of claim 1, wherein each lens element is substantially flat.

5. The method of claim 1, wherein each of the lens elements is at least one of a Fresnel lens, Total Internal Reflection type lens, a diffractive lens, photonic crystal type lens, a prism, and a reflective lens.

6. The method of claim 1, wherein the submount comprises at least one metal trace formed on the surface of or within the submount, wherein one of the plurality of light emitting diode dies is electrically connected to the metal trace.

7. The method of claim 6, wherein at least one of the light emitting diode dies is an inverted type having all of a plurality of electrical contacts on a bottom surface of the light emitting diode die wherein the plurality of electrical contacts are between the submount and the bottom surface of the light emitting diode die.

8. The method of claim 1, wherein the encapsulant bonds the lens system to the submount with a plurality of light emitting diode dies.

9. The method of claim 1, wherein:
the submount is one of a plurality of integrally formed submounts;
the plurality of light emitting diode dies are positioned and mounted on each of the plurality of submounts;
the lens system is one of a plurality of lens systems integrally formed in an array; and
optically coupling the submount with the plurality of mounted light emitting diode dies to the lens system so that each of the lens elements is aligned with a corresponding light emitting diode die comprises mounting the array of the integrally formed plurality of lens systems over the plurality of light emitting diodes to form a plurality of devices;
the method further comprising separating the plurality of devices.

10. The method of claim 1, wherein each of the lens elements is an asymmetric Fresnel lens.

11. The method of claim 1, wherein a distance between the focal points of the lens elements is smaller than a distance between centers of the light emitting diode dies.

12. A method comprising:
providing a plurality of submounts;
positioning and mounting a plurality of light emitting diode dies on the plurality of submounts, the plurality of light emitting diode dies being positioned to be separated from each other;
providing a plurality of lens systems, each lens system comprising adjacent asymmetric lens elements;

optically coupling the plurality of light emitting diode dies to the plurality of lens systems so that each of the lens elements is aligned with a corresponding light emitting diode die; and providing an encapsulant in a region that is disposed between the at least one submount with the plurality of light emitting diode dies and the lens system.

13. The method of claim 12, wherein optically coupling the plurality of light emitting diode dies to the plurality of lens systems forms a plurality of devices, the method further comprising separating the plurality of devices.

14. The method of claim 13, wherein a separation between the light emitting diode dies, a separation between optical centers of the lens elements, and the alignment of the lens elements with a respective light emitting diode die are configured to produce a desired light distribution on target at a predefined distance.

15. The method of claim 12, wherein the plurality of light emitting diode dies are positioned to be separated from each other by a distance greater than 130% center to center of the size of the light emitting diode dies.

16. The method of claim 12, wherein each lens element is substantially flat.

17. The method of claim 12, wherein each of the lens elements is at least one of a Fresnel lens, Total Internal Reflection type lens, a diffractive lens, photonic crystal type lens, a prism and a reflective lens.

18. The method of claim 12, wherein the at least one submount comprises at least one metal trace formed on the surface of or within the submount, wherein one of the plurality of light emitting diode dies is electrically connected to the metal trace.

19. The method of claim 18, wherein at least one of the light emitting diode dies is an inverted type having all of a plurality of electrical contacts on a bottom surface of the light emitting diode die wherein the plurality of electrical contacts are between the at least one submount and the bottom surface of the light emitting diode die.

20. The method of claim 12, wherein the encapsulant bonds the lens system to the at least one submount with the plurality of light emitting diode dies.

21. The method of claim 12, wherein each of the lens elements is an asymmetric Fresnel lens.

22. The method of claim 12, wherein a distance between the focal points of the lens elements is smaller than a distance between centers of the light emitting diode dies.

23. A method comprising:

providing a submount;

positioning and mounting a plurality of light emitting diode dies on the submount, the plurality of light emitting diode dies being positioned to be separated from each other;

providing a lens system comprising adjacent asymmetric lens elements;

providing an encapsulant in a region that is disposed between the submount with a plurality of light emitting diode dies and the lens system; and optically coupling the submount with the plurality of mounted light emitting diode dies to the lens system so that each of the lens elements is aligned with a corresponding light emitting diode die wherein the lens elements are separated from each other, and wherein a separation between the light emitting diode dies, a separation between centers of the lens elements, and an alignment of the lens elements with a respective light emitting diode die are configured to produce a desired light distribution on target at a predefined distance.

24. The method of claim 23, wherein each of the lens elements is an asymmetric Fresnel lens.

25. The method of claim 23, wherein a distance between the centers of the lens elements is smaller than a distance between centers of the light emitting diode dies.

* * * * *